United States Patent
Suzuki

(10) Patent No.: US 11,741,121 B2
(45) Date of Patent: *Aug. 29, 2023

(54) COMPUTERIZED DATA COMPRESSION AND ANALYSIS USING POTENTIALLY NON-ADJACENT PAIRS

(71) Applicant: Takashi Suzuki, Scottsdale, AZ (US)

(72) Inventor: Takashi Suzuki, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/951,954

(22) Filed: Nov. 18, 2020

(65) Prior Publication Data

US 2021/0157818 A1     May 27, 2021

Related U.S. Application Data

(60) Provisional application No. 62/939,448, filed on Nov. 22, 2019.

(51) Int. Cl.
*G06F 16/174*     (2019.01)
*G06F 16/25*     (2019.01)
(Continued)

(52) U.S. Cl.
CPC ........ *G06F 16/258* (2019.01); *G06F 16/1744* (2019.01); *G06F 16/2379* (2019.01); *H03M 7/3088* (2013.01)

(58) Field of Classification Search
CPC ............... G06F 16/258; G06F 16/2379; G06F 16/1744; H03M 7/3088; H03M 7/4062; H03M 7/702
See application file for complete search history.

(56) References Cited

U.S. PATENT DOCUMENTS 5,020,121 A * 5/1991 Rosenberg .............. G06T 9/004
                                               358/1.9
5,260,693 A    11/1993 Horsley
(Continued)

FOREIGN PATENT DOCUMENTS

CN         100595596 C     3/2010
JP          H01286627 A    11/1989
(Continued)

OTHER PUBLICATIONS

Horspool, R. Nigel and Cormack, Gordon V.; Constructing Word-Based Text Compression Algorithms; Data Compression Conference, 1992.

(Continued)

*Primary Examiner* — Cheyne D Ly
(74) *Attorney, Agent, or Firm* — Snell & Wilmer L.L.P.

(57) ABSTRACT

A computerized method of compressing symbolic information organized into a plurality of documents, each document having a plurality of symbols, includes: (i) automatically identifying a plurality of sequential and non-sequential symbol pairs in an input document; (ii) counting the number of appearances of each unique symbol pair; and (iii) producing a compressed document that includes a replacement symbol at each position associated with one of the plurality of symbol pairs, at least one of which corresponds to a non-sequential symbol pair. For each non-sequential pair the compressed document includes corresponding indicia indicating a distance between locations of the non-sequential symbols of the pair in the input document. In some instances the plurality of symbol pairs includes only those pairs of non-sequential symbols for which the distance between locations of the non-sequential symbols of the pair in the input document is less than a numeric distance cap.

20 Claims, 4 Drawing Sheets

(51) Int. Cl.
*H03M 7/30* (2006.01)
*G06F 16/23* (2019.01)

(56) References Cited

U.S. PATENT DOCUMENTS

| | | | |
|---|---|---|---|
| 5,389,922 | A | 2/1995 | Seroussi et al. |
| 5,594,435 | A | 1/1997 | Remillard |
| 5,617,552 | A | 4/1997 | Garber et al. |
| 5,704,060 | A | 12/1997 | Del Monte |
| 5,883,588 | A * | 3/1999 | Okamura ............ H03M 7/3086 341/5 |
| 5,884,269 | A | 3/1999 | Cellier et al. |
| 5,995,954 | A | 11/1999 | Loos |
| 6,054,943 | A | 4/2000 | Lawrence |
| 6,356,660 | B1 | 3/2002 | Shannon |
| 6,400,289 | B1 | 6/2002 | Banerji |
| 6,414,610 | B1 | 7/2002 | Smith |
| 6,597,812 | B1 | 7/2003 | Fallon et al. |
| 6,674,908 | B1 * | 1/2004 | Aronov ............... H03M 7/3088 382/248 |
| 6,720,894 | B2 | 4/2004 | Wilson et al. |
| 6,804,401 | B2 | 10/2004 | Nelson et al. |
| 7,365,658 | B2 | 4/2008 | Todorov et al. |
| 7,375,662 | B2 | 5/2008 | Wilson et al. |
| 7,428,341 | B2 | 9/2008 | Suzuki et al. |
| 7,515,762 | B2 | 4/2009 | Suzuki et al. |
| 8,108,204 | B2 | 1/2012 | Gabrilovich et al. |
| 8,373,584 | B2 | 2/2013 | Trezise et al. |
| 8,924,330 | B2 | 12/2014 | Antebi et al. |
| 9,390,098 | B2 | 7/2016 | Teerlink |
| 9,647,682 | B1 | 5/2017 | Heng |
| 9,792,291 | B2 * | 10/2017 | Shih ....................... G06F 16/16 |
| 10,387,377 | B2 | 8/2019 | Suzuki |
| 11,269,810 | B2 | 3/2022 | Suzuki |
| 2002/0152219 | A1 | 10/2002 | Singh |
| 2002/0154040 | A1 | 10/2002 | Vataja |
| 2003/0028509 | A1 * | 2/2003 | Sah ....................... G06F 16/284 |
| 2003/0131184 | A1 | 7/2003 | Kever |
| 2006/0181443 | A1 * | 8/2006 | Lee ......................... H03M 7/40 341/90 |
| 2009/0271181 | A1 | 10/2009 | Balegar et al. |
| 2011/0016097 | A1 | 1/2011 | Teerlink |
| 2011/0173166 | A1 | 7/2011 | Teerlink |
| 2012/0026020 | A1 | 2/2012 | Korodi |
| 2012/0179680 | A1 | 7/2012 | Isaacson |
| 2014/0282205 | A1 | 9/2014 | Teplitsky |
| 2016/0210508 | A1 * | 7/2016 | Ideuchi .................. G06F 40/12 |
| 2017/0139947 | A1 | 5/2017 | Abed et al. |
| 2017/0187734 | A1 | 6/2017 | Lee et al. |
| 2019/0207624 | A1 * | 7/2019 | Cassetti ............. H03M 7/6029 |
| 2019/0286618 | A1 | 9/2019 | Suzuki |
| 2021/0102263 | A1 | 5/2021 | Suzuki |

FOREIGN PATENT DOCUMENTS

| | | |
|---|---|---|
| JP | H03247167 A | 11/1991 |
| JP | 2012124878 A | 6/2012 |
| JP | 2016-052046 A | 4/2016 |
| JP | 2016052046 A | 4/2016 |
| JP | 2016184830 A | 10/2016 |
| JP | 2017022630 A | 1/2017 |
| KR | 10-2011-0027679 A | 3/2011 |
| KR | 10-1023536 B1 | 3/2011 |
| WO | 2000/035098 A1 | 6/2000 |
| WO | 2007/050018 A1 | 5/2007 |
| WO | 2018213783 A1 | 11/2018 |

OTHER PUBLICATIONS

Dictionary Techniques (Lempel-Ziv Codes); at http://www.mini.pw.edu.pl/~herbir/www/?download=notes%208.pdf; 2014.
Keramidas, et al.; Dynamic Dictionary-Based Data Compression for Level-1 Caches; Architecture of Computing Systems—ARCS 2006; Lecture Notes in Computer Science, vol. 3894; 2006.
Arora, Nitin and ARORA, Esha; Dynamic Word Based Data Compression Algorithm for Text Using Tagged SUB Optimal Code (TSC); International Journal of Advanced Technology & Engineering Research (IJATER) 1st International Conference on Research in Science, Engineering & Management (IOCRSEM 2014) 2014.
Kosko, Bart; Adaptive bidirectional associative memories; Applied Optics; vol. 26, No. 23; pp. 4947-4960; Dec. 1, 1987.
Kosko, Bart; Bidirectional Associative Memories; IEEE Transactions on Systems, Man, and Cybernetics; vol. 18, No. 1; Jan./Feb. 1988.
Manger, Robert and Puljic, Krunoslav; Multilayer Perceptrons and Data Compression; Computing and Informatics vol. 26, pp. 45-62; 2007.
You Can Say That Again!—Text Compression; Computer Science Unplugged at http://csunplugged.org/wp-content/uploads/2014/12/unplugged-03-text_compression.pdf; 2002.
Sayood, Khalid; Introduction to Data Compression (Chapters 1, 3, and 5); Elsevier Inc.; 2012.
Lin, Ming-Bo; A Hardware Architecture for the LZW Compression; Journal of VLSI Signal Processing 26, pp. 369-381; 2000.
Mesut, Altan and Carus, Aydin; A New Approach to Dictionary-Based Lossless Compression; International Scientific Conference-Gabrovo; Nov. 18-19, 2004.
Ye, Yan and Cosman, Pamela; Dictionary design for text image compression with JBIG2; IEEE Transactions on Image Processing; vol. 10, No. 6; Jun. 2001.
Kuruppu, Shanika et al.; Iterative Dictionary Construction for Compression of Large DNA Data Sets; IEEE/ACM Transactions on Computational Biology and Bioinformatics; vol. 9, No. 1; pp. 137-149; Jan./Feb. 2012.
Storer, James A.; Lossless Image Compression Using Generalized LZ1-Type Methods; Proceedings IEEE Data Compression Conference; pp. 290-299; 1996.
Larsson, N. Jesper and Moffat, Alistair; Off-Line Dictionary-Based Compression; Proceedings of the IEEE; vol. 88, No. 11, pp. 1722-1732; Nov. 2000.
Claude, Francisco and Navarro, Gonzalo; Self-Indexed Text Compression using Straight-Line Programs; Fundamenta Informaticae XXI; IOS Press; pp. 1001-1023; 2001.
Kieffer, J.C. et al.; Universal lossless compression via multilevel pattern matching; IEEE Transactions on Information Theory, vol. 46, No. 4; pp. 1227-1245; Jul. 1, 2000.
Deorowicz; Sebastian; Universal lossless data compression algorithms; Doctor of Philosophy Dissertation; Silesian University of Technology Faculty of Automatic Control, Electronics and Computer Science Institute of Computer Science; 2003.
Shibata, Yusuke et al.; Speeding Up Matching by Text Compression; CIAC2000, LNCS 1767, pp. 306-315; 2000.
Clustor Case Studies: Byte Pair Encoding: The Problem; http://web.archive.org/web/20031027234441/http://www.csse.monash.edu.au/cluster/RJK/Compress/problem.html; Oct. 27, 2003.
Cinque, L. et al.; Scalability and Communication in Parallel Low-Complexity Lossless Compression, Mathematics in Computer Science (Abstract only); vol. 3, Issue 4, pp. 391-406, Jun. 2010-406.
PCT; International Search Report & Written Opinion dated Mar. 10, 2021 in PCT/US2020/061508.
PCT; International Search Report & Written Opinion dated Aug. 21, 2018 in PCT application No. PCT/ US2018/33510.
Larsson et al.; Offline Dictionary-based compression, Data Compression Conference, 1999, Proceedings. DCC 99 Snowbird, Ut, USA Mar. 29-31, 1999, Los Alamitos, Ca., USA, IEEE Comput. Soc. US, Mar. 1, 299999 (1999-03-29, pp. 296-305, XP010329132, XP010329132.
Philip Gage: A New Algorithm for Data Compression, Dec. 31, 1994 (1994-12-31), XP055765182.
Dario et al. .: Non Sequential Recursive Pair Substitution: Some Rigorous Results, ARXIV.ORG, Cornell University Library, 201 Olin Library Cornell University Ithaca, NY 14853, Jul. 28, 2006 IP080245230.
PCT; International Search Report & Written Opinion dated Mar. 20, 2023 in PCT Application No. PCT/ US2022/050617.

(56) References Cited

OTHER PUBLICATIONS

PCT; International search Report & Written Opinion dated Mar. 10, 2021 in PCT Application No. PCT/ US2020/061508.

* cited by examiner

COMPUTERIZED DATA COMPRESSION AND ANALYSIS USING POTENTIALLY NON-ADJACENT PAIRS

BENEFIT CLAIMS TO RELATED APPLICATIONS

This application claims benefit of U.S. provisional App. Ser. No. 62/939,448, filed Nov. 22, 2019, which is hereby incorporated by reference in its entirety.

FIELD OF THE INVENTION

The field of the present invention relates to data compression and analysis. Specifically, the invention involves specific techniques thought useful for improved lossless compression of text and other information that can be represented by symbols.

SUMMARY

A computerized method of compressing symbolic information organized into a plurality of documents is disclosed. Each document has a plurality of symbols. With a first document of the plurality of documents as an input document, a computer automatically identifies a plurality of symbol pairs. Each symbol pair consists of two sequential or non-sequential symbols in the input document; at least one symbol pair consists of two non-sequential symbols in the input document. The computer counts the number of appearances of each unique symbol pair. The computer produces a compressed document that includes a corresponding replacement symbol at each position associated with one of the plurality of symbol pairs from the input document. At least one replacement symbol corresponds to a symbol pair consisting of two non-sequential symbols, and for each such pair the compressed document includes corresponding indicia indicating a distance between locations of the non-sequential symbols of the pair in the input document. In some instances the plurality of symbol pairs includes only those pairs of non-sequential symbols for which the distance between locations of the non-sequential symbols of the pair in the input document is less than a numeric distance cap.

Objects and advantages pertaining to data compression and analysis may become apparent upon referring to the example illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1:
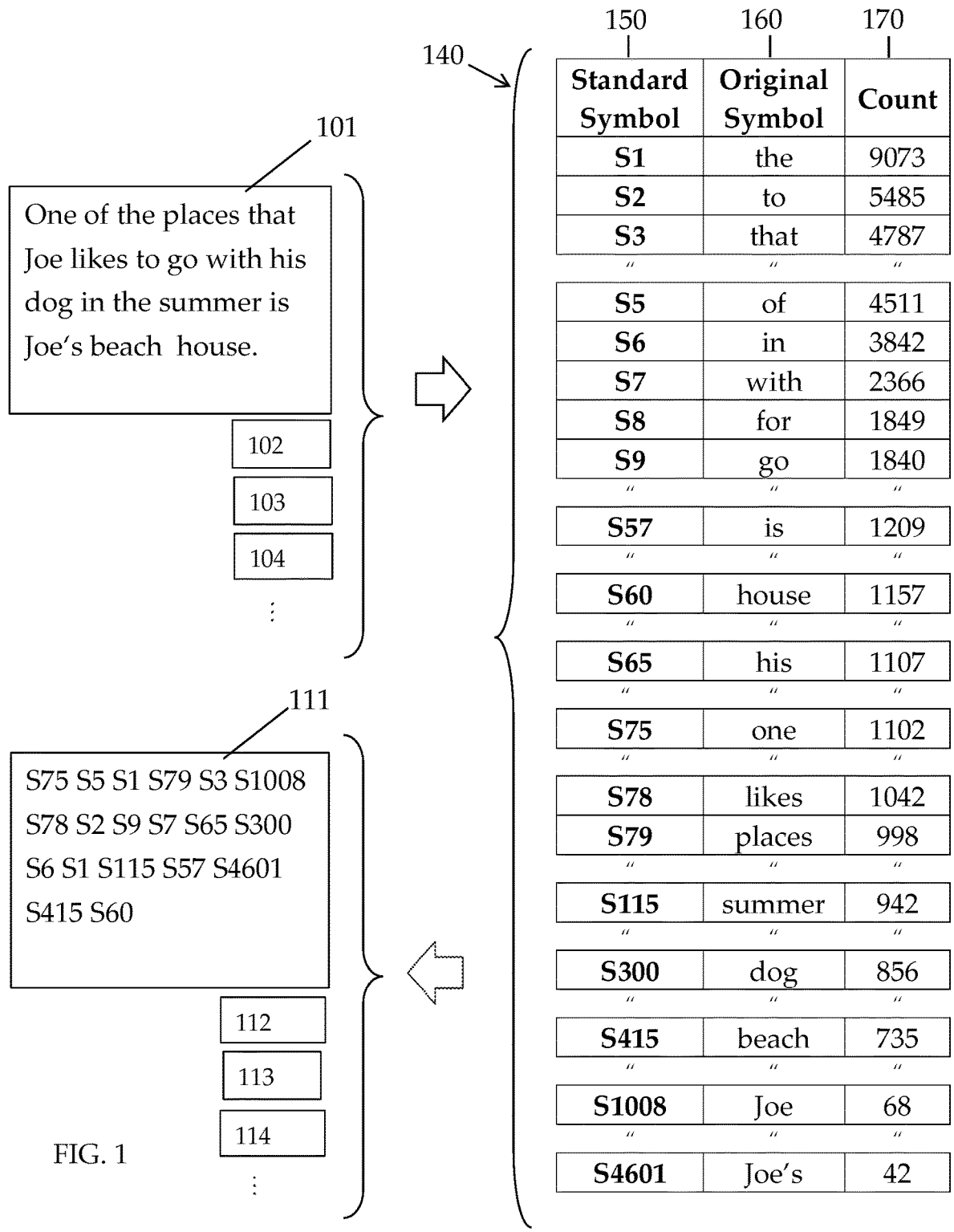
FIG. 1 is a visual representation of an example of a symbol dictionary generated by and employed in compression methods disclosed herein.

The embodiments depicted are shown only schematically; all features may not be shown in full detail or in proper proportion; for clarity certain features or structures may be exaggerated or diminished relative to others or omitted entirely. The embodiments shown are only examples and should not be construed as limiting the scope of the present disclosure or appended claims.

DETAILED DESCRIPTION

This disclosure describes what may be considered extensions or improvements of applicant's issued U.S. Pat. No. 10,387,377 ("the patent"), which is hereby incorporated by reference in its entirety (including figures and computer code appendix) as if set forth in full herein. The disclosure of the patent was first published Nov. 22, 2018.

For ease of description, this disclosure initially describes an example central embodiment, with only some discussion of variations. It is intended, though, that the disclosed central embodiment, and equivalents thereof, can be modified to create variations. Some variations or options (or purposes for applying the disclosed techniques) are discussed here, some are summarized here with more detail provided in the patent, and some are described in the patent but generally equally applicable to this disclosure (with the exception of any portions that clearly and necessarily conflict with teachings herein). Terminology may differ slightly between the patent and this disclosure.

The embodiments described herein group various features (including method steps or acts) together for the purpose of streamlining the disclosure. This method of disclosure is not to be interpreted as reflecting an intention that any particular embodiment requires each and every features recited. Nor is the term "embodiment" intended to refer to a necessary combination of features. The term "embodiment" is not intended to reflect exclusion of features discussed in connection with different embodiments or with no embodiment at all. Nor is any feature to be considered "essential" or "necessary" to any particular or all embodiments, unless explicitly stated.

Rather, it is contemplated that any particular feature or group of features discussed herein can be isolated from other features, even if disclosed in connection with a particular "embodiment" having additional features. In addition, a feature or group of features from one embodiment can be combined with features discussed elsewhere, or in the patent (unless clearly and necessarily inconsistent). The present disclosure shall be understood, therefore, as disclosing any embodiment having any suitable set of one or more features (i.e., a set of features that are neither incompatible nor mutually exclusive) that appear in (including via incorporation) the present disclosure, including combinations of features that may not be explicitly disclosed in a combination in a particular embodiment.

This disclosure generally describes apparatus for and methods of compressing information that is organized into one or more documents. Each uncompressed document has a plurality of symbols. A document can contain or consist of a string of symbols of any length (e.g., a sentence, a paragraph, a text file, or a library of other documents). The disclosure can be applied to multiple documents considered individually as well. The compression ratio is expected to improve as the size of the uncompressed data increases, which can be achieved by using multiple or longer documents. The larger the data set, the more replacements produced by the disclosed systems and the higher the compression achieved.

A symbol can be any code that constitutes or carries information (e.g., a letter, number, non-alphanumeric character, syllable, or word). Symbols can constitute or represent alphanumeric characters, discrete groups of alphanumeric characters such as syllables or words, or numeric information of various types. If representative, a symbol can consist of any code that carries information, encoded in any way. For example, an ASCII code is a numeric representation of a letter of the alphabet or a special character. Various encoding schemes are possible. Other coded symbols can represent words for example.

For purposes of this disclosure, the article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. For purposes of this disclosure, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives.

For purposes of this disclosure, words "comprising," "including," "having," and variants thereof, wherever they appear, shall be construed as open-ended terminology, with the same meaning as if the phrase "at least" were appended after each instance thereof.

The disclosed computerized data compression and data analysis systems (including apparatus and processes) may (not must) offer various objects and advantages.

In particular, general text compression techniques are typically usable on one file or document at a time. Such techniques do not scale easily to enormous data sets, i.e., "Big Data," or where data is spread across many different containers. Disclosed computerized data compression and data analysis systems may have advantages in improving compression for Big Data.

Also, compression techniques generally do not track the number of times a particular symbol or string of symbols appears in uncompressed text. That is valuable information, useful for saving space, reducing processing time, or conducting contextual analysis. Disclosed computerized data compression and data analysis systems may have advantages resulting from retaining such information.

General text compression techniques also typically rely on compressing symbols or strings of symbols that are adjacent to one another. Disclosed computerized data compression and data analysis systems may have advantages resulting from ability to compress or analyze based on either or both adjacent or non-adjacent symbols.

Other objects or advantages may become apparent from the example embodiments disclosed below.

The disclosure here contemplates implementing data compression and data analysis systems with a computer. Disclosed techniques can be programmed in computer code as a set of computer instructions. Even if programmed on a general-purpose computer, such a computer should be considered non-generic and special-purpose once adapted because of the presence of specific programmed computer instructions, which control at least one computer processor and cause it to perform the functions described herein. Alternative instantiations can be accomplished equivalently with dedicated special-purpose computers or dedicated computer appliances, rather than program-adapted general-purpose computing machines. Either way, the specially programmed or structured computer comprises an improved computing machine that accomplishes functions not possible with computers not so constructed or adapted.

Computer instructions (e.g., computer software, if used in lieu of hardware-wired machines), can be stored in any computer memory accessible to the computer or encoded in computer hardware. The documents on which the embodiments operate can be stored in the same or a different computer memory accessible to the computer.

References to "a computer" or "computer" (or simply references to computer-programmed operations) should be understood to allow for implementation on either a single computer or on multiple computers, such as a system of interconnected devices, or a set of devices using distributed processing techniques. Each computer device, also, may utilize one or more processors.

The word "step" is intended to refer to computer operations or acts, or phases, in the case of a method, or computer equipment programmed to perform such operations or acts, in the case of an apparatus. The word is not intended as having any special legal meaning.

The disclosure focuses on a method or process, but the disclosure should be understood to refer equally to equipment or apparatus, such as a computer, that implements such methods or processes, as well as to computer instructions stored in tangible media that control a computer to implement such methods or processes.

The example central embodiment disclosed here is illustrated with respect to a series of symbols, each symbol standing for a word, and with respect to a single document. Those choices have been selected for ease of description, but other alternatives are possible, as indicated in the definitions of "document" and "symbol" above.

The illustrative central method includes the following steps.

Step 1: Make a pass through the document 101 (see FIG. 1), replacing the words in the document 101 with associated symbols (denoted S1, S2, S3, . . . , Sn, . . . ), while creating a symbol dictionary (e.g., table 140 of FIG. 1) correlating symbols with words that respective symbols symbolize.

The document 111 containing the symbols may be considered an input document to the method discussed. It may be desired to store the symbolic version (input document 111) in a separate memory location while retaining the original document 101.

During the pass, check for duplication, and if found, increment a count of the number of instances of each word.

When the pass is complete, the symbol dictionary contains a series of entries, each having a symbol (e.g., column 150 of the table 140), the word associated with that symbol (e.g., column 160 of the table 140), and a count of the number of times that word appears in the document (e.g., column 170 of the table 140).

If multiple corresponding symbolic documents (e.g., 112, 113, 114, . . . ) are so created with the same encoding from multiple original documents (e.g., 102, 103, 104, . . . ), efficiencies can result. The symbol dictionary can be viewed as a standardization memory, allowing encoding or decoding of any or all of the multiple documents.

Step 2: Optionally, sort the dictionary by order of frequency.

Figure 4:
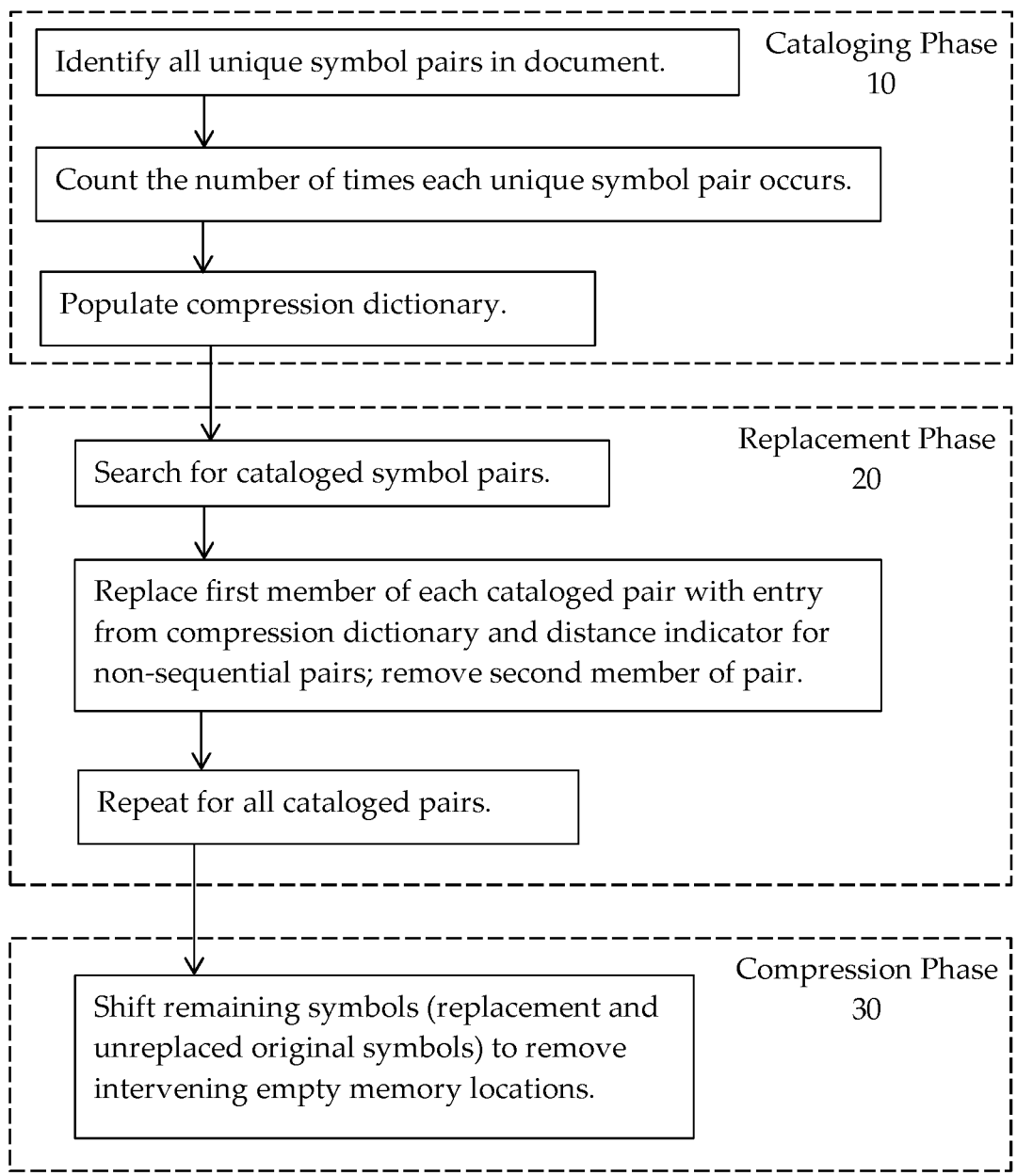
FIG. 4 is a flow diagram showing operation of compression methods disclosed herein.

Step 3: In a cataloging phase 10 (e.g., see FIG. 4), make passes through the input document 111 (and input documents 112, 113, 114, . . . , if present), creating a table of unique pairs of symbols, adjacent or not.

For example, start with the pair consisting of the symbols in the first and second locations, using the order of appearance in the document 111, then the symbols in the first and third locations, and then continue until reaching the symbols in the first and last locations.

Optionally, a numeric cap can be imposed to limit the number of locations, so that the process will consider only locations separated by less than the cap. For example, if the cap is ten words (and the document has more than ten words), then the process will continue through the symbols in the first and tenth locations, rather than through the symbols in the first and last locations.

After completing all (or the limited number) of pairs that include the first appearing symbol, continue with the symbols paired with the symbol in the second location. Start with the symbols in the second and third locations, then those in the second and fourth, and continue through the second and last (or through the second and eleventh, if the cap is ten, for example).

Then continue to repeat the process through the symbols in the penultimate and last locations. At that point, all combinations have been considered (assuming no cap).

Parallel processing computers can usefully assist with the cataloging phase 10 if desired, because the number of combinations expands with the factorial of the number of symbols and can grow large readily, especially with Big Data scenarios. The numeric cap, also, can be imposed to reduce the number of possible combinations to improve speed of this phase. As computers become faster and more powerful, the speed of this phase becomes less of an important consideration.

Figure 2:
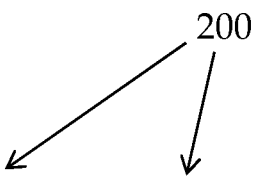
FIG. 2 is a visual representation of an example of a compression dictionary generated by and employed in compression methods disclosed herein.

As the symbol pair at each location described above is encountered, add it to a table (e.g., table 200 of FIG. 2), if that pair is being encountered for the first time, or increment a counter in the table associated with the symbol pair, if the same pair has been encountered previously at one or more different location pairs, such that the table 200 already contains it.

The table 200 may be considered a compression dictionary, which associates unique stored symbol pairs with respective replacement symbols, keeping a count of the number of times the different symbol pairs appear in the input document 111 (or multiple input documents 111, 112, 113, . . . ).

Step 4: Sort the table 200 (compression dictionary) based on the frequency of appearance of a symbol pair. Sorting has the advantage of placing more frequently appearing symbol pairs in more accessible memory locations than less frequently appearing symbol pairs. This potentially facilitates decreased lookup times during a replacement phase 20 discussed below.

Step 5: Optionally, truncate the table 200 using a threshold. For example, entries can be removed from the table where the counters indicate that particular pairs of symbols have occurred only in one location each. For another example, the table can be truncated to remove entries reflecting symbol pairs that have occurred only once or twice. A higher threshold can be used as well. This step, if done, can reduce further the calculation overhead, perhaps at the cost of only some loss with respect to the degree of compression.

Step 6: In a replacement phase 20 (e.g., see FIG. 4), make further passes through the input document 111, using the table 200 of symbol pairs to replace symbol pairs with replacement symbols. Each replacement symbol indicates one of the corresponding symbol pairs. Store with the replacement symbol data specifying the distance between the locations at which the two members of a symbol pair are found (e.g., a number of intervening symbols, in which case adjacent symbols can be assigned a distance of zero; other distance schemes can be employed).

For example, starting with the most frequently occurring pair, and beginning at the first location in the document, scan the input document for the first occurrence of the first member of the symbol pair (Location1). From the location immediately after Location1, search forward until locating the first occurrence of the second member of the same symbol pair (Location2). If the optional numeric cap discussed above limits the number of locations, the "search forward" process here would stop after that number of locations. When the second member of the same symbol pair is found (Location2), perform three acts: (a) Replace the symbol at Location1 with the replacement symbol indicating the symbol pair (from the compression dictionary). (b) Include data specifying the distance between Location1 and Location2. (c) Delete the symbol at Location2.

The distance between two locations can be specified by a number indicating the count of places (e.g., number of words or symbols) between the two locations, the difference between two location numbers, or any other method. If the two symbols in a pair happen to be in adjacent locations, the distance may be considered "0" in a system specifying the number of words between locations. A number may be dropped entirely for adjacent locations in some embodiments. Absolute locations of the second symbol of a pair can be used instead of the relative addressing described in this paragraph if desired.

Next, beginning from the next location after Location1, search forward until locating the next occurrence of the first member of the same symbol pair (Location3). From the next location after Location3, search forward, again limited by the numeric cap if present, until locating the next occurrence of the second member of the same symbol pair (Location4). Replace the symbol at Location3 with the same replacement symbol indicating the symbol pair, include at Location3 indicia of the distance between Location3 and Location4, and delete the symbol at Location4. Continue until all instances of the most frequently occurring symbol pair have been exhausted.

Repeat the process with the next most frequently occurring pair. This will cause insertion of a different replacement symbol, also found in the compression dictionary, this time signifying the second pair. Repeat the process again for all symbol pairs in the (possibly truncated) compression dictionary.

Figure 3:
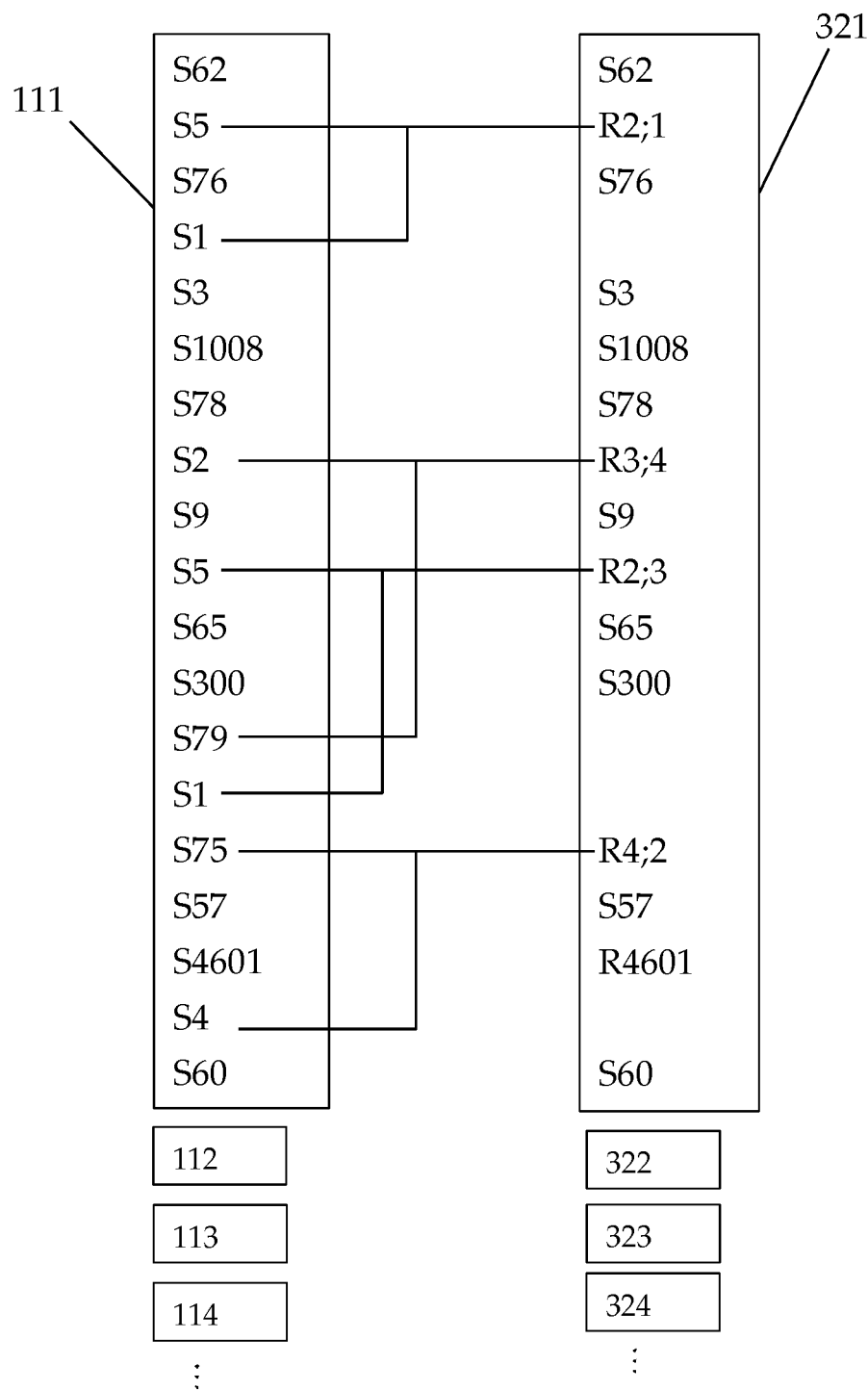
FIG. 3 is a visual representation of replacement of symbol pairs according to compression methods disclosed herein.

In the example of FIG. 3, the symbol pair "S5 S1" appears twice, and is replaced by "R2;1" in the first instance (indicating one symbol or symbol location between them) and is replaced by "R2;3" in the second instance (indicating three symbols or symbol locations between them). Similarly, in that example the symbol pair "S2 S79" is replaced by "R3;4" and "S75 S4" by "R4;2". Further replacement can be made based on other symbol pairs from the table 200 that appear in the document 111.

Note that the compression dictionary may contain instances in which two different symbol pairs have one symbol in common. For example, the most frequently occurring symbol pair may symbolize Word1 in combination with Word2 while a less frequently occurring symbol pair may symbolize Word3 in combination with Word2. For illustration, the top pair may symbolize the words "is . . . a" while the other pair symbolizes "are . . . a." In such instances, the number of replacements in a later pass through the document may result in fewer replacements than the frequency recorded in the compression dictionary, because some instances of the common word have been "used up" during the prior pass and thus are not available to be combined with the non-identical member of the lower-ranking symbol pair. This is not a problem, though, because it is considered advantageous to give higher priority to more frequently occurring symbol pairs. In some instances, if the number of replacements of a particular symbol pair fall below the threshold (or possibly a different threshold, or perhaps to zero) as a result of this effect, then that symbol pair may be truncated as well, to avoid further evaluation and storage of null entries or entries considered of limited value.

Step 7: In a compression phase 30 (e.g., see FIG. 4), produce a compressed output document by shifting the remaining symbols (replacement and unreplaced original symbols) so that they are in sequence, i.e., removing intervening empty memory locations. In the example of FIG. 3, output document 321 is shown before such compression; it will become shorter than document 111 when the spaces are removed.

It may be desired to shift after the replacement phase 20 concludes entirely, because unless shifting occurs after the entire replacement phase 20 ends, the measurements stated will not identify the actual number of words between those locations or may contain ambiguities. In FIG. 3 for example, the second instance of "S5 S1" is replaced with "R2;3" (at the location of the second occurrence of "S5"), indicative of the three symbols or symbol locations between them before any shifting has occurred (i.e., before the location of "S79" is removed by shifting due to replacement of "S2" with "R3;4").

Alternatively, step 7 can be done during step 6, either as each deletion is made, after each "pass" for each symbol pair, or in some other pattern (such as after a specified number of deletions or passes). If shifting can be done quickly, this may avoid the need to check empty memory locations.

Suppose shifting occurs after the top-ranked symbol pair is used to make replacements but before the process occurs for the next-ranked symbol pair. If one of the symbols in the top-ranked symbol pair has been deleted from an intermediate location, i.e., between the two symbols of the lower-ranking symbol pair, then the number indicating the distance between the two symbols of a lower-ranking symbol pair will not accurately list the number of words between those locations. In the example of FIG. 3, if the location of "S79" has already been removed, then the second occurrence of "S5 S1" would be replaced by "R2;2" at the location of "S5", instead of "R2;3 as described above and shown in FIG. 3. Nevertheless, it still may identify a location between adjacent remaining symbols (either symbols identifying unreplaced words or replacement symbols indicating the first member of a word pair).

If shifting is done before the replacement phase 20 concludes entirely, further, the process must adjust other distance measurements that span the removed memory location. For example, suppose location 10 contains a replacement symbol with the number 3, indicating that there were three memory locations between the locations of the first and the second symbols of that pair. Put another way, the number 3 indicates that the second symbol of the pair was found after location 13. Note that location 15 shifts one location lower with the removal of location 14. Now suppose a later replacement causes deletion of memory location 12 because that is the second member of the later pair. At that time, if shifting is done immediately, location 13 shifts to location 12. Now, the number 3 for the first pair, stated at location 10, must be changed to the number 2, to indicate that there are now only two memory locations between the locations of the first and the second symbols of that pair (i.e., the second member of that first pair is found after what is now location 12). To accomplish such adjustments, upon doing the shifting, such an immediate-shifting embodiment checks the data (subject to the cap on maximum distance if present) in previous locations to determine which have numbers referring to locations after the memory location being deleted.

As a result of the replacements and shifting, whenever it occurs, the document compresses. When the process finishes steps 6 and 7, whether or not those are combined, the compressed table 321 (with blanks removed; see FIG. 3) can be considered as an output document.

Again, alternatively, instead of overwriting the series of symbols representing the input document, the output document can be written in a different memory location while keeping the input document as well. However, if the input document (containing the symbols) has been saved separately from the original document (containing the actual words) in the first place, there is likely no need to save the input document, as the original document exists and the input document acts as a working copy anyway.

Step 8: Optionally, repeat the compression process by using the output document as an input document for another cycle, and further optionally repeat such cycles recursively.

At the inception of the first such additional cycle (second cycle overall), a symbol at a given location does not represent a single word but rather a word pair, separated by a stated distance. If such symbols occur in several locations in the input document, it indicates that a word pair is commonly used with a given separation. A document may contain repeated uses of a given phrase, or a given form. For instance, a variety of sentences may appear beginning with the words, "The <subject> is <object>" with the subject and object being different in different sentences, but the words "The" and "is" may be frequently paired at a fixed, non-adjacent distance. This may also occur with more substantive words of course, and patterns of more substantive words of course provide more interesting information for analysis. If such a word-pair commonly appears close to a different word-pair, in the first additional cycle, those two symbol pairs will appear in the input document to that cycle frequently in association with one another. The second cycle, if present, thus would cause replacement of the associated "pair of pairs" with a single, second-level replacement symbol, signifying four words (with specified spacings between each pair). A third cycle, if present, operating on second-level replacement symbols, would create third-level replacement symbols signifying eight-word combinations, and so forth.

Such a recursive process can operate for a fixed number of cycles. Or the process can perform cycles recursively until no further possible replacements are detected, which would result in the highest possible compression. Or the process can repeat for a maximum number of cycle unless, before the maximum is reached, no further possible replacements are detected.

If truncation is desired, or a cap is used (in both cases as those options are discussed in connection with the first cycle), such numbers applied during successive cycles can differ from the corresponding numbers applied during the first cycle or use the same numbers.

The replacement symbols can be the address of the replaced symbol pair in the compression dictionary. In some cases, the replacement symbol can be just the row identifier in a spreadsheet. In some cases with recursive cycles, the replacement symbol can be just the portion of the address associated with a row identifier in a spreadsheet, where columns represent sequential cycles and it can be assumed from context that the column refers to the previous cycle. Such embodiments thereby can achieve increased space savings and decreased lookup time needed to access the compression dictionary.

The patent discusses various uses of, or ways to apply, the compression techniques. Likewise, the modified processes disclosed above can be applied to compression or for any of the various other purposes listed in the patent.

For example, in some embodiments, a system can use patterns of replacement symbols and associated counts to analyze content or investigate texts. Especially if recursive cycles are used, the presence of higher-order replacement symbols can be used to deduce a relationship between different documents, suggesting two texts are related in some fashion. Metadata, such as the number of times certain pairs appear, generated during compression of documents can be used to analyze documents and find similarities therebetween.

The system can be applied (as noted above) to analyze various sorts of data that can be symbolized other than by words, which can lead to still further applications. One example is facial recognition based on numeric (or other) coding of different facial dimensions or characteristics, which can be used, for example, to control access to a secure location, such as a physical place (e.g., a building) or a device (e.g., a computer system, database, or secured portion thereof). The system can be used not only for recognizing faces but also (or instead) for distinguishing whether or not certain measurements represent a human face or for the purpose of improving facial recognition systems.

The system can also be used to infer preferences or interests (such as for advertising) or to determine commonalities of interest.

Any combinations of the numbered steps listed above (with or without the options described), in combination with any selected one of the applications (compression or any other) described herein can be considered an example embodiment taught by this disclosure.

Computer code (Microsoft Visual Basic for Applications 7.1 in Microsoft Excel 2016) for one example implementation of the compression process, wherein the symbols operated on are words, is disclosed in U.S. provisional App. Ser. No. 62/939,448, incorporated by reference herein, as stated above.

The systems and methods disclosed herein, implemented using a "programmed computerized machine," can be implemented as or with general or special purpose computers or servers or other programmable hardware devices programmed through software, or as hardware or equipment "programmed" through hard wiring, or a combination of the two. A "computer" or "server" can comprise a single machine or can comprise multiple interacting machines (located at a single location or at multiple remote locations). Computer programs or other software code, if used, can be implemented in tangible, non-transient, temporary or permanent storage or replaceable media, such as by including programming in microcode, machine code, network-based or web-based or distributed software modules that operate together, RAM, ROM, CD-ROM, CD-ft CD-R/W, DVD-ROM, DVD±R, DVD±R/W, hard drives, thumb drives, flash memory, optical media, magnetic media, semiconductor media, or any future computer-readable storage alternatives. Electronic indicia of a dataset can be read from, received from, or stored on any of the tangible, non-transitory computer-readable media mentioned herein.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A computerized method of compressing symbolic information organized into a plurality of documents, each document having a plurality of symbols, the method comprising: with a first document of the plurality of documents as an input document, automatically with a computer:
   (a) identifying a plurality of symbol pairs, each symbol pair consisting of two sequential or non-sequential symbols in the input document, one or more symbol pairs consisting of two non-sequential symbols in the input document;
   (b) for each unique symbol pair of the plurality of symbol pairs, updating a count identifying the number of appearances of the unique symbol pair;
   (c) producing a compressed document by causing the compressed document to include, at each position associated with one of the plurality of symbol pairs from the input document, including one or more symbol pairs consisting of two non-sequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two non-sequential symbols, indicia indicating a distance between locations of the non-sequential symbols of the pair in the input document; and
   (d) sorting the compression dictionary in order of the count for the respective unique symbol pairs, and excluding or removing from the compression dictionary all unique symbol pairs having a count that does not exceed the threshold and making an association in the compression dictionary between each unique symbol pair having a count that exceeds the threshold and a replacement symbol.

2. The method of claim 1 wherein the plurality of symbol pairs includes only those pairs of non-sequential symbols for which the distance between locations of the non-sequential symbols of the pair in the input document is less than a numeric distance cap.

3. The method of claim 2 wherein the numeric distance cap is ten symbols.

4. The method of claim 1 wherein the threshold is two.

5. The method of claim 1 further comprising performing an additional pass by repeating parts (a), (b), and (c) using as the input document the compressed document.

6. The method of claim 5 further comprising performing additional passes, until the compressed document created by one of the passes is unaltered from the compressed document created by the immediately previous pass.

7. The method of claim 1 wherein each symbol from the first document indicates a word.

8. The method of claim 7 further comprising, before part (a), creating the first document by replacing each word of a text document with a corresponding one of the plurality of symbols.

9. The method of claim 1 wherein each symbol in the first document indicates an alphanumeric character.

10. The method of claim 1 wherein each replacement symbol comprises an address of an entry in the compression dictionary, which entry stores the unique symbol pair associated with replacement symbol.

11. The method of claim 1 further comprising performing parts (a), (b), and (c) on each of the other documents of the plurality of documents, wherein the respective counts for the symbol pairs identifies the number of previous appearances of that symbol pair in any of the plurality of documents.

12. The method of claim 11 wherein parts (a) and (b) are performed on each of the plurality of documents before part (c) is performed on any of the plurality of documents.

13. The method of claim 12 further comprising, before part (c) is performed on any of the plurality of documents, making an association in the compression dictionary between each unique symbol pair and a replacement symbol if and only if the unique symbol pair has a count that exceeds the threshold.

14. The method of claim 11 further comprising sorting the compression dictionary in order of the count for the respective unique symbol pairs.

15. The method of claim 14 further comprising removing from the compression dictionary all unique symbol pairs having a count that does not exceed the threshold and making an association in the compression dictionary between each unique symbol pair having a count that exceeds the threshold and a replacement symbol.

16. The method of claim 11 further comprising repeating parts (a), (b), and (c) on each of the other documents to make at least one additional pass by repeating parts (a), (b), and (c), using as the input document the compressed document previously produced by the process, until the compressed document created by one of the passes is unaltered from the compressed document created by the immediately previous pass.

17. The method of claim 16 further comprising assigning the first document at least one of a plurality of attributes based on the frequency with which a replacement symbol associated with a unique symbol pair appears in an output document associated with the first document.

18. The method of claim 17 further comprising suggesting a related document based the at least one attribute of the first document and the at least one attribute of the related document.

19. A computer system having at least one processor capable of compressing symbolic information organized into a plurality of documents, each document having a plurality of symbols, the computer system programmed to:
with a first document of the plurality of documents as an input document, automatically with the processor:
(a) identify a plurality of symbol pairs, each symbol pair consisting of two sequential or non-sequential symbols in the input document, one or more symbol pairs consisting of two non-sequential symbols in the input document;
(b) for each unique symbol pair, update a count identifying the number of appearances of the symbol pair;
(c) produce a compressed document by causing the compressed document to include, at each position associated with one of the plurality of symbol pairs from the input document, including one or more symbol pairs consisting of two non-sequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two non-sequential symbols, indicia indicating a distance between locations of the non-sequential symbols of the pair in the input document; and
(d) sorting the compression dictionary in order of the count for the respective unique symbol pairs, and excluding or removing from the compression dictionary all unique symbol pairs having a count that does not exceed the threshold and making an association in the compression dictionary between each unique symbol pair having a count that exceeds the threshold and a replacement symbol.

20. A computer-readable storage medium that is not a transitory propagating signal storing a set of computer instructions for compressing symbolic information organized into a plurality of documents, each document having a plurality of symbols, wherein the set of computer instructions, when executed on the computer, causes the computer, automatically:
with a first document of the plurality of documents as an input document, automatically:
(a) to identify a plurality of symbol pairs, each symbol pair consisting of two sequential or non-sequential symbols in the input document, one or more symbol pairs consisting of two non-sequential symbols in the input document;
(b) for each unique symbol pair, to update a count identifying the number of appearances of the symbol pair;
(c) to produce a compressed document by causing the compressed document to include, at each position associated with one of the plurality of symbol pairs from the input document, including one or more symbol pairs consisting of two non-sequential symbols, (i) a replacement symbol associated by a compression dictionary with the unique symbol pair matching the one of the plurality of symbol pairs, if the count for the unique symbol pair exceeds a threshold, and (ii) for at least those symbol pairs consisting of two non-sequential symbols, indicia indicating a distance between locations of the non-sequential symbols of the pair in the input document; and
(d) sorting the compression dictionary in order of the count for the respective unique symbol pairs, and excluding or removing from the compression dictionary all unique symbol pairs having a count that does not exceed the threshold and making an association in the compression dictionary between each unique symbol pair having a count that exceeds the threshold and a replacement symbol.

* * * * *